United States Patent
Park et al.

(10) Patent No.: US 9,425,793 B2
(45) Date of Patent: Aug. 23, 2016

(54) CIRCUIT FOR GENERATING BIAS VOLTAGE FOR HIGH SPEED INPUT/OUTPUT PAD

(71) Applicant: SMARTPHY INC., Gyeonggi-do (KR)

(72) Inventors: Jaewoo Park, Seoul (KP); Ook Kim, Seoul (KR)

(73) Assignee: ALPHACHIPS Corp., Seongnam-si, Gyeonggi-do (KR)

( * ) Notice: Subject to any disclaimer, the term of this patent is extended or adjusted under 35 U.S.C. 154(b) by 0 days.

(21) Appl. No.: 14/653,112

(22) PCT Filed: Dec. 17, 2012

(86) PCT No.: PCT/KR2012/011020
§ 371 (c)(1),
(2) Date: Jun. 17, 2015

(87) PCT Pub. No.: WO2014/098273
PCT Pub. Date: Jun. 26, 2014

(65) Prior Publication Data
US 2015/0326224 A1    Nov. 12, 2015

(51) Int. Cl.
*H03K 19/003* (2006.01)
*H03K 19/0185* (2006.01)
*H03K 19/0175* (2006.01)

(52) U.S. Cl.
CPC  *H03K 19/00361* (2013.01); *H03K 19/017509* (2013.01); *H03K 19/018507* (2013.01)

(58) Field of Classification Search
CPC .............. H03K 19/018507; H03K 19/00361; H03K 19/017509
USPC ..................... 327/538–544; 361/56; 323/273
See application file for complete search history.

(56) References Cited

U.S. PATENT DOCUMENTS

| | | | |
|---|---|---|---|
| 6,635,930 B1 * | 10/2003 | Hauptmann | H02H 9/046 257/355 |
| 8,154,272 B2 | 4/2012 | Kim et al. | |
| 8,314,649 B1 * | 11/2012 | Okamoto | H03H 11/245 327/536 |
| 8,350,555 B2 | 1/2013 | Kim et al. | |
| 2003/0006832 A1 * | 1/2003 | Ikehashi | G05F 1/465 327/541 |
| 2010/0148797 A1 | 6/2010 | Ker et al. | |
| 2012/0049939 A1 | 3/2012 | Maede | |

FOREIGN PATENT DOCUMENTS

| | | |
|---|---|---|
| JP | 2008042996 A | 2/2008 |
| JP | 2008134687 A | 6/2008 |
| KR | 1020090126812 A | 12/2009 |

OTHER PUBLICATIONS

International Search Report (in Korean with English Translation) for PCT/KR2012/011020, mailed Jun. 26, 2014; ISA/KR.
Written Opinion for PCT/KR2012/011020 (in Korean with English Translation), mailed Jun. 26, 2014; ISA/KR.

* cited by examiner

*Primary Examiner* — Dinh T Le

(57) ABSTRACT

The present invention provides a circuit for generating a bias voltage for a high speed input/output pad. To this end, a bias voltage generator according to an embodiment of the present invention is to supply at least one bias voltage to a buffer circuit connected to the pad, which includes: a bias generation part for generating a first bias voltage; and a reference voltage generation part for generating a voltage proportional to the pad voltage applied to the pad as a reference voltage, wherein the first bias voltage may be the sum of the reference voltage and a predetermined voltage.

15 Claims, 14 Drawing Sheets

US 9,425,793 B2

CIRCUIT FOR GENERATING BIAS VOLTAGE FOR HIGH SPEED INPUT/OUTPUT PAD

TECHNICAL FIELD

The present invention relates to a circuit for generating a bias voltage for a high-speed input/output pad. More particularly, the present invention relates to a bias circuit which is provided in an input/output pad to protect an input/output buffer circuit from a high input/output voltage.

BACKGROUND ART

An input/output buffer circuit is a circuit for transmitting and receiving a chip-to-chip signal, and has various shapes according to a type of a system used.

In general, for exchanging the chip-to-chip signal, a voltage level may be greater than a power source voltage used within the chips.

The voltage level exceeds a voltage allowable for a single stage of transistors, and thus the voltage should be distributed using several stages of transistors.

There may be present a block (or circuit) for generating a necessary bias within an input/output circuit, in order to stably distribute the voltage.

An input/output circuit having a fail-safe function is an input/output circuit which is prepared for a case where there is any one chip (or a chip required for a fail-safe operation) without power supplied thereto in a system, namely, a case where the aforementioned bias circuit does not operate due to non-presence of a power supply in the input/output buffer circuit.

FIG. 1 is a circuit diagram illustrating a digital input/output circuit having a typical type of a fail-safe function.

As illustrated in FIG. 1, an input/output (I/O) circuit may include an IO driver block 20 for outputting an IO voltage, an electrostatic discharge (ESD) protection circuit 30, and a bias generator block 10 for performing a fail-safe operation.

Transistors constructing the input/output circuit should be used at a voltage of 2V or less during process, and an input/output voltage of 3.3V is assumed.

For the fail-safe operation, under a situation that a voltage of a power source is 0V (VDDPST=0) and a voltage of a pad PAD of 3.3V is applied, a voltage of a first bias BIAS1 should be generated to correspond to a half level of the voltage of the pad PAD so as to be less than 2V which is an allowable value of a voltage applied to MNB1.

A second bias voltage BIAS2 should be biased to 3.3V which is the same as the voltage of the pad in order to prevent a flow of current in a reverse direction, namely, to a direction toward the VDDPST due to a reverse turn-on of Mpb1. Or, the second bias voltage BIAS2 should be biased to 3.3V which is the same as the voltage of the pad in order to meet the allowable voltage of Mpb1.

NWBIAS of 3.3V which is the same as the voltage of the pad PAD should be applied to prevent a turn-on of a junction diode between a drain terminal and a bulk (or a body) of Mpb1.

Hereinafter, a problem of the related art bias generation circuit will be described, for example, based on the first bias voltage BIAS1.

When desiring to generate a half voltage by using the voltage of the pad as a power supply (or a power source), similar to a bias1 generator 10 illustrated in FIG. 1, diodes are disposed in series to generate an intermediate voltage.

In an ideal manner, a stabilized voltage of the first bias BIAS1 may be generated by always maintaining it to be the same as about 0.5*PAD voltage.

The diode-type voltage distribution method used herein generates a bias required for the fail-safe operation by consuming a predetermined current from the pad. Therefore, the voltage distribution method is subject to a restriction that such current should be below a predetermined level.

For an input/output circuit with a great load which results from a size of a transistor constructing a circuit such as an electrostatic discharge (ESD) or the like, a predetermined time is generally required for generating the bias using such small current. This may bring about a restriction of an operation speed of the input/output circuit.

FIG. 2 is a conceptual view illustrating an affection of parasitic capacitor components in a typical bias generating circuit.

As illustrated in FIG. 2, when an input/output signal is fast, it is necessary to take into account parasitic components present within the input/output circuit.

A driver and an ESD circuit present within the circuit may use a transistor with a great width for the purpose of driving a great current, and have a great parasitic capacitor.

Regarding the parasitic capacitor, as illustrated in FIG. 2, a high frequency path from the pad to a node of the first bias may be created by the parasitic capacitor.

Therefore, at the moment when the pad PAD fast changes from 0V to 3.3V, the voltage of the first bias BIAS1 may be more than 2V which is an allowable voltage value of the transistor.

To prevent this, a method of restricting a voltage by applying a diode with a great capacity to the node of the first bias may be considered.

However, a generally-used diode is difficult to generate various levels of voltages because of a great threshold voltage of 800 mV. The threshold voltage may make it difficult to stably restrict a voltage due to its unstable changes depending to processes.

DISCLOSURE OF THE INVENTION

Therefore, an aspect of the detailed description is to provide a circuit for generating a bias voltage for a high-speed input/output pad.

To achieve these and other advantages and in accordance with the purpose of the present invention, as embodied and broadly described herein, there is provided a bias voltage generator, in a bias voltage generator configured to supply at least one bias voltage to a buffer circuit connected to a pad, the generator including a bias generating part configured to generate a first bias voltage of the at least one bias voltage, and a reference voltage generating part configured to generate a voltage proportional to a pad voltage applied to the pad as a reference voltage, wherein the first bias voltage is a voltage that is the sum of the reference voltage and a set voltage.

In one embodiment according to the present invention, the bias generating part may include a first resistor and a first switching element. The first resistor may be connected between the pad and a first output node for outputting the first bias voltage, and the first switching element may be connected between the first output node and a ground node. The reference voltage may be applied to a gate terminal of the first switching element.

In one embodiment according to the present invention, the first switching element may be a p-type MOS transistor, and the set voltage may be a threshold voltage corresponding to the first switching element.

In one embodiment according to the present invention, the reference voltage generating part may generate the reference voltage on the basis of a voltage distribution between the pad voltage and a ground voltage corresponding to a ground node.

In one embodiment according to the present invention, the reference voltage generating part may include a second resistor and a third resistor, and the voltage distribution may be carried out based on the second resistor and the third resistor.

In one embodiment according to the present invention, the second resistor may be connected between the pad and a reference node, and the third resistor may be connected between the reference node and the ground node. The reference voltage may be a voltage corresponding to the reference node.

In one embodiment according to the present invention, the buffer circuit may include a pull-up switching element, a pull-down switching element, and an N-type bias transistor connected between the pull-up switching element and the pull-down switching element. The pad may be connected to a contact node between the pull-up switching element and the N-type bias transistor. The first bias voltage may be applied to a gate terminal of the N-type bias transistor.

In one embodiment according to the present invention, the bias voltage generator may be supplied with a first power source and a second power source. The bias voltage generator may output a voltage corresponding to the first power source as the first bias voltage when both of the first power source and the second power source are activated. The bias voltage generator may output the voltage, which is the sum of the set voltage and the reference voltage, as the first bias voltage when both of the first power source and the second power source are not activated. A voltage corresponding to the second power source may be greater than a voltage corresponding to the first power source.

In one embodiment according to the present invention, the power corresponding to the first power source may be 1.8V, and the voltage corresponding to the second power source may be 3.3V.

In one embodiment according to the present invention, the bias generating part may further include a second switching element. A source terminal of the second switching element may be supplied with the first power source, and a gate terminal of the second switching element may be supplied with the second power source. A drain terminal of the second switching element may be connected to a node for outputting the first bias.

In one embodiment according to the present invention, the reference voltage generating part may generate the voltage corresponding to the first power source as the reference voltage when both of the first power source and the second power source are activated. The reference voltage generating part may generate the voltage proportional to the pad voltage applied to the pad as the reference voltage when both of the first power source and the second power source are not activated.

In one embodiment according to the present invention, the reference voltage generating part may further include a third switching element. A source terminal of the third switching element may be supplied with the first power source, and a gate terminal of the third switching element may be supplied with the second power source. A drain terminal of the third switching element may be connected to a node for outputting the reference voltage.

In one embodiment according to the present invention, the bias generating part may generate a second bias voltage. The second bias voltage may be a voltage corresponding to the second power source when both of the first power source and the second power source are activated. The second bias voltage may be the same voltage as the first bias voltage when both of the first power source and the second power source are not activated.

In one embodiment according to the present invention, the bias voltage generator may further include a fourth switching element and a fifth switching element. The bias voltage generator generates a third bias voltage of the at least one bias voltage. The fourth switching element may be turned on in response to the second bias voltage and thus the first bias voltage may be generated as the third bias voltage when both of the first power source and the second power source are activated. The fifth switching element may be turned on in response to the second bias voltage and thus the pad voltage applied to the pad may be generated as the third bias voltage when both of the first power source and the second power source are not activated.

In one embodiment according to the present invention, the bias voltage generator may further include a sixth switching element and a seventh switching element. The bias generator may generate an N-well bias voltage of the at least one bias voltage. The sixth switching element may be turned on in response to the third bias voltage and thus the voltage corresponding to the second power source may be generated as the N-well bias voltage when both of the first power source and the second power source are activated. The seventh switching element may be turned on in response to the second bias voltage and thus the pad voltage applied to the pad may be generated as the N-well bias voltage when both of the first power source and the second power source are not activated.

In one embodiment according to the present invention, the buffer circuit may include a pull-up switching element, a pull-down switching element, and a P-type bias transistor and an N-type bias transistor connected between the pull-up switching element and the pull-down switching element. A source terminal of the P-type bias transistor may be connected to a drain terminal of the pull-up switching element, and a source terminal of the N-type bias transistor may be connected to a drain terminal of the pull-down switching element. The pad may be connected to a contact node between the P-type bias transistor and the N-type bias transistor. The first bias voltage may be applied to a gate terminal of the N-type bias transistor and the third bias voltage may be applied to a gate terminal of the P-type bias transistor. The N-well bias voltage may be connected to a body terminal of the P-type bias transistor.

Advantageous Effect

In accordance with one embodiment of the detailed description, a bias voltage generator for a high-speed input/output pad is provided.

Specifically, according to one embodiment of the present invention, a bias voltage generator which is capable of safely protecting an input/output circuit within a chip under a state where a high-speed signal has been applied, in a manner of further employing a circuit for stably restricting a bias voltage supplied to a buffer circuit within a short time in a fail-safe mode in which any power source is not supplied (or activated), can be provided.

MODES FOR CARRYING OUT THE PREFERRED EMBODIMENTS

Figure 1:
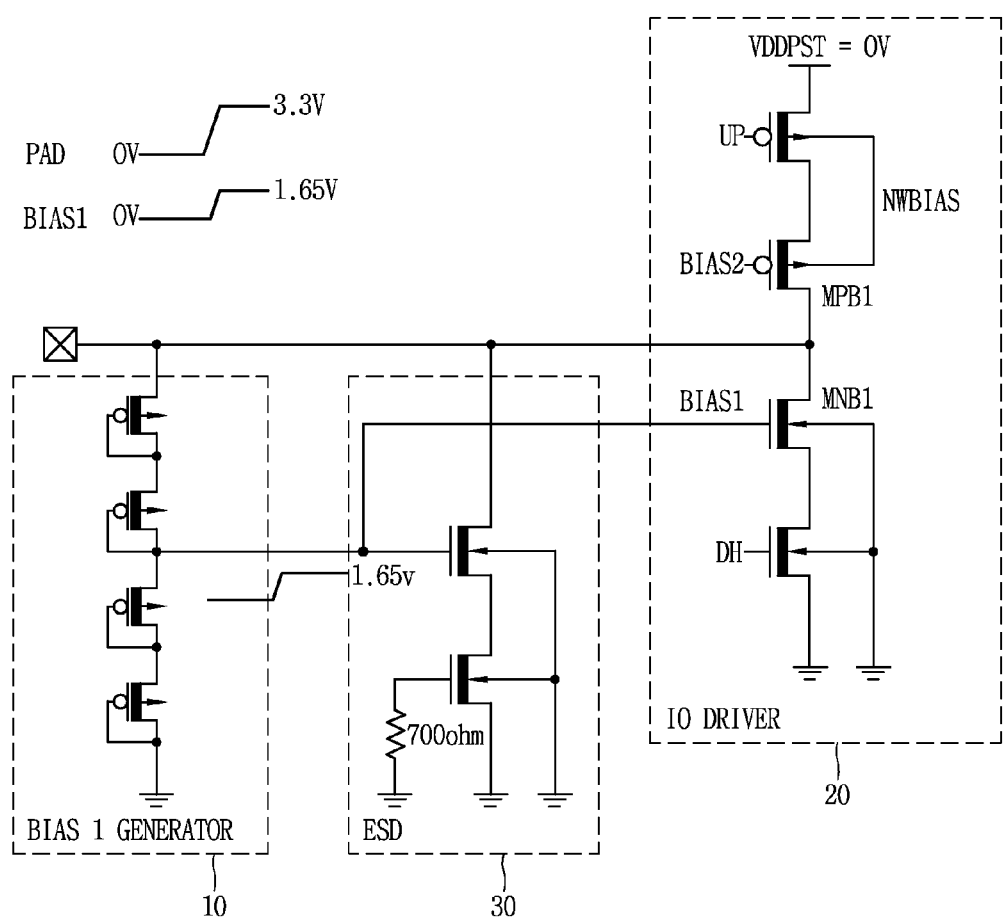
FIG. 1 is a circuit diagram illustrating a digital input/output circuit having a typical type of a fail-safe function.
Figure 2:
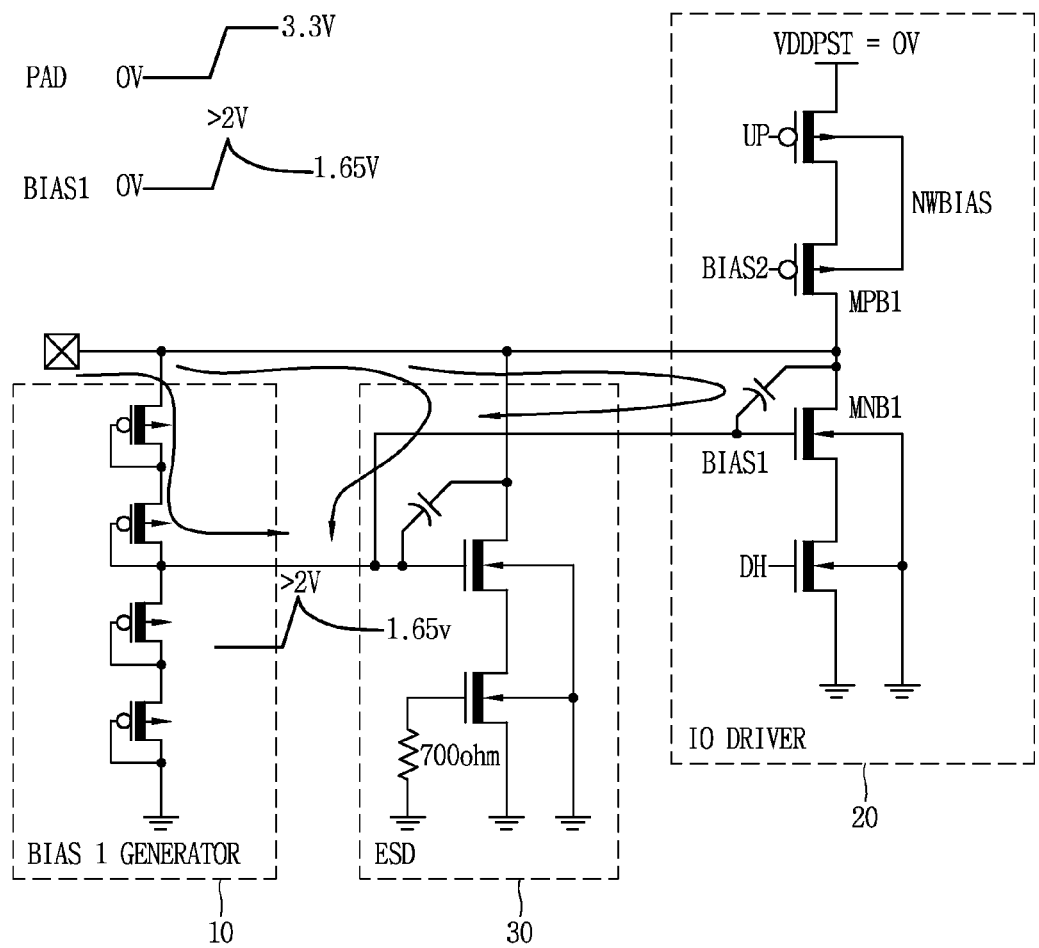
FIG. 2 is a conceptual view illustrating an affection of parasitic capacitor components in a typical bias generating circuit.

The technology disclosed herein will be applied to a circuit for generating a bias voltage for a high-speed input/output pad. However, the technology disclosed herein may not be limited to this, but applicable to all kinds of voltage generating circuits and voltage generating methods to which the technical idea or scope of the technology can be applied.

It should be noted that technological terms used herein are merely used to describe a specific embodiment, but not to limit the present invention. Also, unless particularly defined otherwise, technological terms used herein should be construed as a meaning that is generally understood by those having ordinary skill in the art to which the invention pertains, and should not be construed too broadly or too narrowly. Furthermore, if technological terms used herein are wrong terms unable to correctly express the spirit of the invention, then they should be replaced by technological terms that are properly understood by those skilled in the art. In addition, general terms used in this invention should be construed based on the definition of dictionary, or the context, and should not be construed too broadly or too narrowly.

Incidentally, unless clearly used otherwise, expressions in the singular number include a plural meaning. In this application, the terms "comprising" and "including" should not be construed to necessarily include all of the elements or steps disclosed herein, and should be construed not to include some of the elements or steps thereof, or should be construed to further include additional elements or steps.

In addition, a suffix "module" or "unit" used for constituent elements disclosed in the following description is merely intended for easy description of the specification, and the suffix itself does not give any special meaning or function.

Furthermore, the terms including an ordinal number such as first, second, etc. can be used to describe various elements, but the elements should not be limited by those terms. The terms are used merely for the purpose to distinguish an element from the other element. For example, a first element may be named to a second element, and similarly, a second element may be named to a first element without departing from the scope of right of the invention.

Hereinafter, preferred embodiments of the present invention will be described in detail with reference to the accompanying drawings, and the same or similar elements are designated with the same numeral references regardless of the numerals in the drawings and their redundant description will be omitted.

In describing the present invention, moreover, the detailed description will be omitted when a specific description for publicly known technologies to which the invention pertains is judged to obscure the gist of the present invention. Also, it should be noted that the accompanying drawings are merely illustrated to easily explain the spirit of the invention, and therefore, they should not be construed to limit the spirit of the invention by the accompanying drawings.

As aforementioned, an input/output circuit having a fail-safe function may be provided therein with a bias circuit mounted in an input/output pad to safely protect an input/output buffer circuit from a high input/output voltage when a power source (or a power supply) is not present within a chip.

The bias circuit may generate a stable bias using the pad as a power source and supply the generated bias to an input/output transistor desired to protect, even when a power source is not present, such that a voltage of a predetermined level or more cannot be applied to transistors provided in the input/output circuit.

However, for a fast input/output signal, the bias voltage is instantaneously raised to a voltage of a reference value or more according to an input signal, which operates at high speed, due to an affection of a parasitic capacitor within the circuit, whereby a generation of an accurate voltage is failed. This may result in increasing the speed of the input/output signal.

The present invention provides a technology of solving these problems and an implementation method therefor.

By further employing a circuit for stably restricting a bias voltage of a fail-safe input/output circuit within a short term of time, an input/output circuit within a chip can be safely protected under a situation that a high-speed signal has been applied, so as to increase a fail-safe operation speed of the input/output circuit and simultaneously increase a signal transfer speed of a system using the input/output buffer.

Hereinafter, description will be given of a bias voltage generator (or a generation circuit) according to embodiments disclosed herein, with reference to FIGS. 3 to 16.

Bias Voltage Generator according to One Embodiment of the Present Invention

Figure 3:
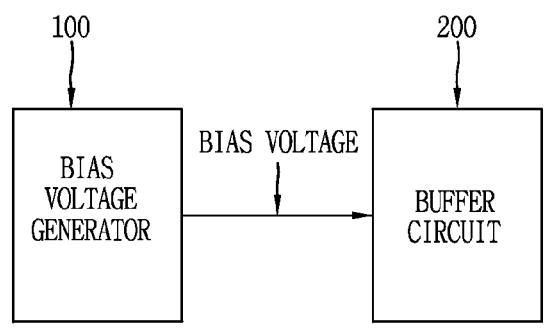
FIG. 3 is a view illustrating a configuration of an input/output (I/O) circuit in accordance with one embodiment disclosed in this specification.

FIG. 3 is a view illustrating a configuration of an input/output (I/O) circuit in accordance with one embodiment disclosed in this specification.

As illustrated in FIG. 3, an input/output circuit according to one embodiment disclosed herein may include a bias voltage generator 100 and a buffer circuit 200.

The bias voltage generator 100 may supply at least one bias voltage to the buffer circuit 200.

The buffer circuit 200 may be a circuit which is generally used in this technical field. For example, the buffer circuit 200 may output data to the exterior through a pad on the basis of the at least one bias voltage and a pull-up or pull-down signal.

A detailed operation of the buffer circuit 200 has been well known in this field, and thus description thereof will be omitted.

Figure 4:
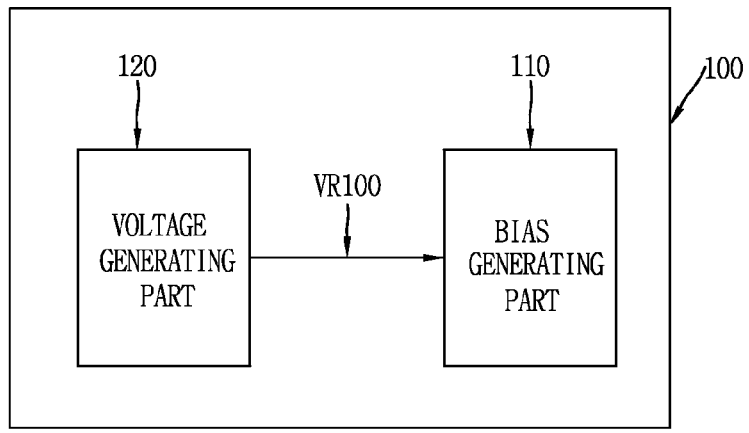
FIG. 4 is a view illustrating a configuration of a bias voltage generator in accordance with one embodiment disclosed in this specification.

FIG. 4 is a view illustrating a configuration of a bias voltage generator in accordance with one embodiment disclosed in this specification.

As illustrated in FIG. 4, the bias voltage generator 100 according to the one embodiment may include a bias generating part 110 and a reference voltage generating part 120.

The bias voltage generator 100 may serve to supply at least one bias voltage to the buffer circuit which is connected to the pad.

In accordance with the one embodiment, the bias generating part 110 may generate a first bias voltage of the at least one bias voltage.

The reference voltage generating part 120 may generate a voltage, which is proportional to a pad voltage applied to the pad, as a reference voltage VR100.

Here, the first bias voltage may be a voltage which is the sum of the reference voltage VR100 and a set voltage.

The bias generating part 110 and the reference voltage generating part 120 may be configured in various manners (or forms). That is, the bias generating part 110 and the reference voltage generating part 120 may have various configurations using various passive elements or active elements.

Hereinafter, description will be given of elements of a bias voltage generator according to one embodiment disclosed herein, with reference to FIG. 5.

Figure 5:
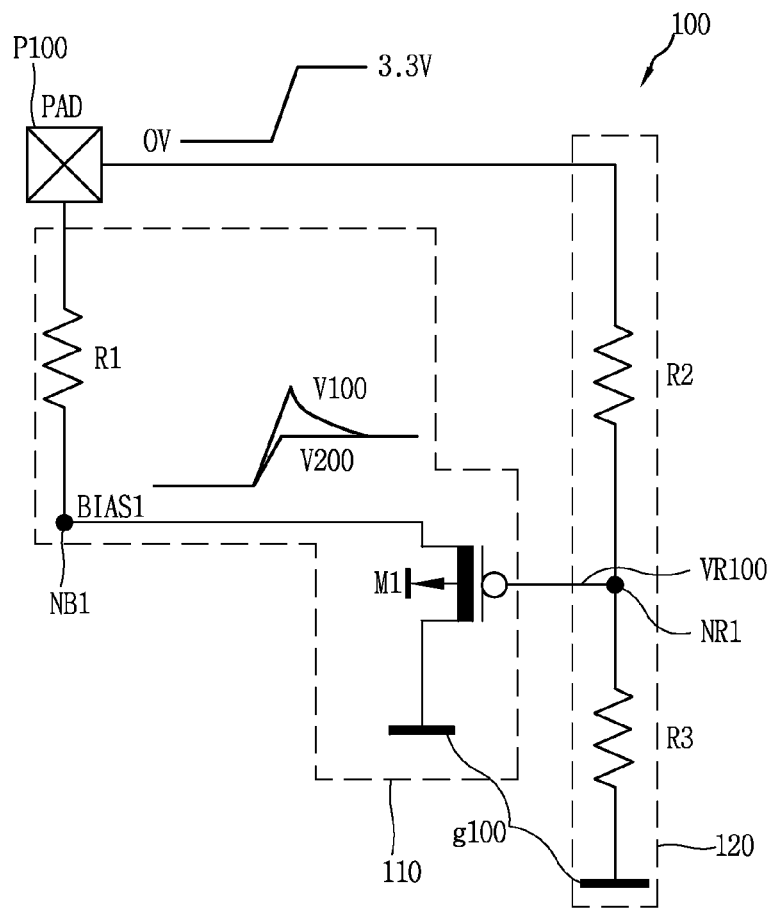
FIG. 5 is a circuit diagram illustrating a bias voltage generator in accordance with one embodiment disclosed in this specification.

FIG. 5 is a circuit diagram illustrating a bias voltage generator in accordance with one embodiment disclosed in this specification.

As illustrated in FIG. 5, the bias generating part 110 may include a first resistor R1 and a first switching element M1.

The first resistor R1 may be located between a pad P100 and a first output node NB1 for outputting a first bias voltage BIAS1.

The first switching element M1 may be connected between the first output node NB1 and a ground node g100.

A voltage corresponding to the ground node g100 may be represented by the generally-used terms in the field to which the present invention belongs. For example, the voltage corresponding to the ground node g100 may be represented by 'VSS' or the like.

The reference voltage VR100 may be applied to a gate terminal of the first switching element M1.

According to one embodiment, the first switching element M1 may be a p-type MOS transistor (see FIG. 5). All kinds of switching elements disclosed hereinafter may indicate at least one of a P-type metal-oxide semiconductor (MOS) transistor and an N-type MOS transistor. Besides to these, it will be obvious to those skilled in the art that various kinds of switching elements (or transistors) can be used in the bias voltage generator 100 according to the one embodiment disclosed herein.

The set voltage may be generated (or used) in various manners. For example, as illustrated in FIG. 5, the set voltage may be a threshold voltage corresponding to the first switching element M1.

The reference voltage generating part 120 may generate the reference voltage VR100 on the basis of a voltage distribution between a voltage corresponding to the pad P100 and a ground voltage corresponding to the ground node g100.

According to the one embodiment, the reference voltage generating part 120 may include a second resistor R2 and a third resistor R3, and the voltage distribution may be carried out based on the second resistor R2 and the third resistor R3.

In this instance, the second resistor R2 may be connected between the pad P100 and a reference node NR1, and the third resistor R3 may be connected between the reference node NR1 and the ground node g100. Here, the reference voltage VR100 may be a voltage corresponding to the reference node NR1.

For example, when the second resistor R2 is 2R and the third resistor R3 is R, the reference voltage VR100 may be '0.3*PAD voltage.'

Also, the voltage of the first bias BIAS1 may be a voltage which is the sum of the set voltage and the reference voltage, namely, '0.3*PAD voltage.'

FIG. 5 illustrates that the set voltage is a threshold voltage corresponding to the first switching element M1.

Hereinafter, operations and characteristics of the bias circuit will be explained in detail. When a data signal which fast changes is applied to the pad P100, the reference voltage generating part 120 (or an R2-R3 voltage distribution circuit) which generates '0.3*PAD voltage' may generate a gate voltage of the first switching element M1.

In view of the circuit configuration, when a voltage of the first bias BIAS1 corresponding to a drain node of the first switching element M1 increases higher than '0.3*PAD voltage' as a gate voltage of the first switching element M1, the first switching element M1 may be turned on and accordingly the voltage of the first bias BIAS1 may be restricted to a specific voltage value (a kind of clamp function). For example, the first bias voltage BIAS1 may be restricted to a voltage value which is the sum of the set voltage (for example, a threshold voltage Vth of the first switching element M1) and the '0.3*PAD voltage' (i.e., '0.3*PAD voltage+Vth(M1),' hereinafter, referred to as a design voltage).

For example, when the pad voltage is 3.3V and the threshold voltage of the first switching element M1 as the set voltage is 0.6V, the design voltage may be 1.7V (1.1V+ 0.6V). As another example, when the threshold voltage is 0.7V, the design voltage may be 1.8V.

Therefore, when there is no function of restricting the voltage of the first bias BIAS1 by the first switching element M1, a voltage waveform of the first bias BIAS1 may be a waveform of a first voltage V100. However, when there is the restricting function, the voltage waveform of the first bias BIAS1 may be a waveform of a second voltage V200.

Here, a source node of the first switching element M1 which is used for discharging uses a global node as a ground node (for example, a node corresponding to VSS). The source node can thusly be allowed for fast discharging.

A voltage level of the first bias voltage BIAS1 may be decided as the design voltage value (for example, '0.3*PAD voltage+Vth(M1)') by the R2-R3 voltage distribution circuit (or the reference voltage generating part 120).

When adjusting a resistance ratio of the resistors R2 and R3, a specific voltage level (or a design voltage level) for restricting the voltage of the first bias BIAS1 can be freely generated.

This method causes a relatively less change in process, compared with a method using diodes, and uses the MOS transistor TR with a small threshold voltage, so as to have an advantage of generating a voltage level which is insensitive to the change in process.

The voltage distribution circuit of the resistors R2 and R3 used in this circuit uses a resistance ratio, and thus mismatch may be negligible.

Figure 6:
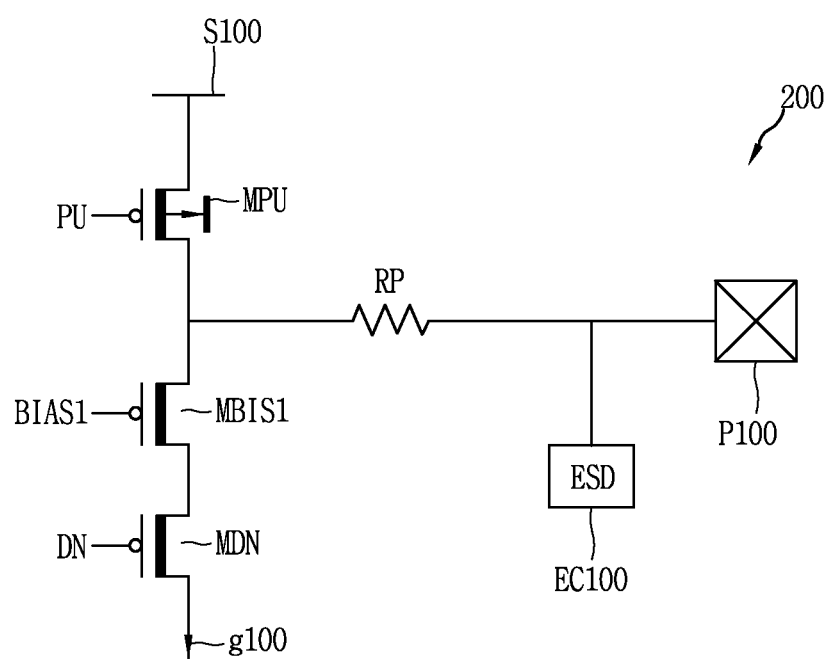
FIG. 6 is a circuit diagram illustrating a buffer circuit in accordance with one embodiment disclosed in this specification.

FIG. 6 is a circuit diagram illustrating a buffer circuit in accordance with one embodiment disclosed in this specification.

As illustrated in FIG. 6, the buffer circuit 200 according to the one embodiment disclosed herein may include a pull-up switching element MPU, a pull-down switching element MDN, and an N-type bias transistor MBIAS1 interposed between the pull-up switching element MPU and the pull-down switching element MDN.

Here, the pad P100 may be connected to a contact node between the pull-up switching element MPU and the N-type bias transistor MBIAS, and the first bias voltage BIAS1 may be applied to a gate terminal of the N-type bias transistor MBIAS1.

A pad resistor RP may be present between the buffer circuit 200 and the pad P100.

Also, the pad P100 may be connected with an ESD circuit EC100.

First Embodiment

Bias Voltage Generator Supplied with Plural Power Sources

A first embodiment disclosed in this specification may be implemented by parts or combination of configurations or steps included in those embodiments or combinations of those embodiments. Hereinafter, for obvious explanation of the first embodiment disclosed herein, repetitive description thereof will be omitted.

According to the first embodiment disclosed herein, a bias voltage generator which supplies at least one bias voltage to a buffer circuit connected to a pad may include a bias generating part that generates a first bias voltage of the at least one bias voltage, and a reference voltage generating part that generates a voltage, which is proportional to a pad voltage applied to the pad, as a reference voltage. Here, the first bias voltage may be the sum of the reference voltage and a set voltage.

Also, according to the first embodiment, the bias voltage generator may be supplied with a first power source (or a first power supply) and a second power source (or a second power supply). When both of the first power source and the second power source are activated (or supplied), the bias voltage generator outputs a voltage corresponding to the first power source as the first bias voltage. On the other hand, when both of the first power source and the second power source are not activated (or not supplied), the bias voltage generator may output a voltage which is the sum of the reference voltage and the set voltage as the first bias voltage.

Here, a voltage corresponding to the second power source may be greater than the voltage corresponding to the first power source. For example, the voltage corresponding to the first power source may be 1.8V and the voltage corresponding to the second power source may be 3.3V.

According to the first embodiment, the bias generating part may further include a second switching element. A source terminal of the second switching element may be supplied with the first power source, and a gate terminal of the second switching element may be supplied with the second power source. Also, a drain terminal of the second switching element may be connected to a node for outputting the first bias.

In this instance, the reference voltage generating part may generate the voltage corresponding to the first power source as the reference voltage when both of the first power source and the second power source are activated, and generate the voltage proportional to the pad voltage applied to the pad as the reference voltage when both of the first power source and the second power source are not activated.

In this instance, according to the first embodiment, the reference voltage generating part may further include a third switching element. A source terminal of the third switching element may be supplied with the first power source, and a gate terminal of the third switching element may be supplied with the second power source. Also, a drain terminal of the third switching element may be connected to a node for outputting the reference voltage.

Figure 7:
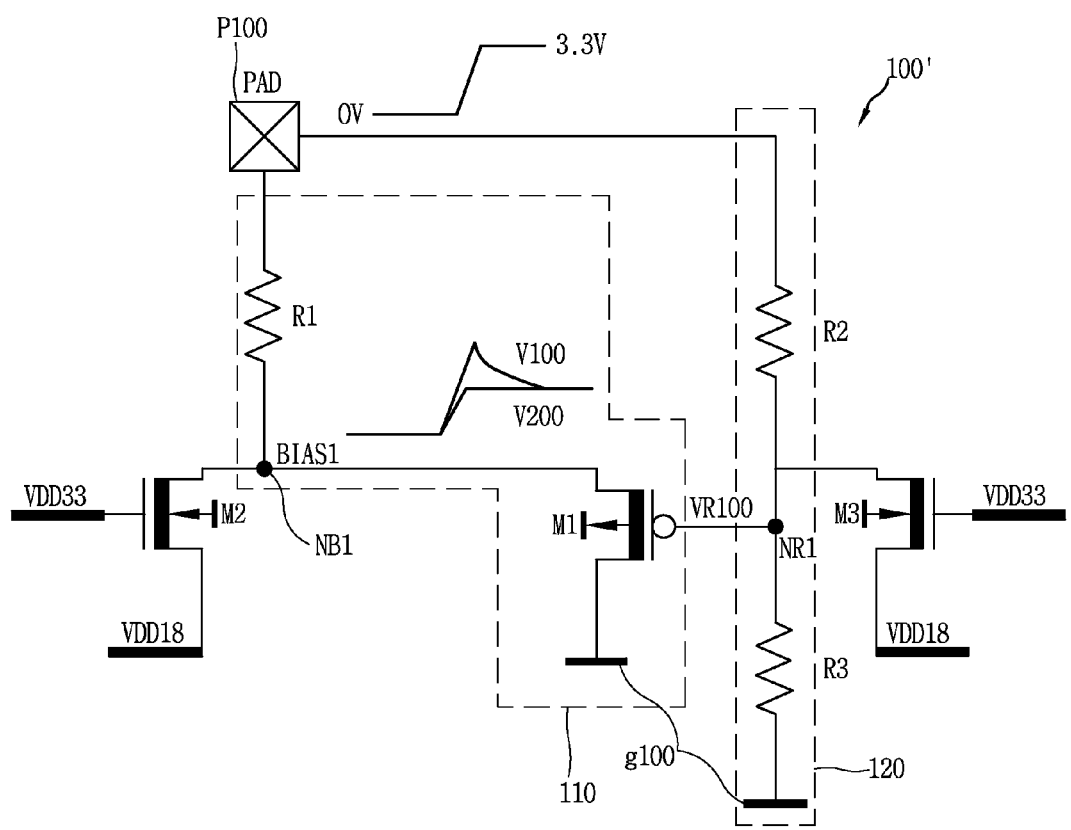
FIG. 7 is an exemplary view illustrating a bias voltage generator in accordance with a first embodiment disclosed in this specification.

FIG. 7 is an exemplary view illustrating a bias voltage generator in accordance with a first embodiment disclosed in this specification.

As illustrated in FIG. 7, a bias voltage generator 100' according to a first embodiment disclosed herein may include a bias generating part 110' and a reference voltage generating part 120'.

As illustrated in the configuration of FIG. 7, the bias generating part 110' may further include a second switching element M2. A source terminal of the second switching element M2 may be supplied with a first power source VDD18, and a gate terminal of the second switching element M2 may be supplied with a second power source VDD33. Also, a drain terminal of the second switching element M2 may be connected to a node NB1 for outputting a first bias BIAS1.

Here, a voltage corresponding to the first power source VDD18 may be 1.8V and a voltage corresponding to the second power source VDD33 may be 3.3V.

Therefore, the bias generating part 110', as illustrated in FIG. 7, may output the voltage (for example, 1.8V) corresponding to the first power source VDD18 as the voltage of the first bias BIAS1 when both of the first power source VDD18 and the second power source VDD33 are activated.

The bias generating part 110' may also output a voltage (design voltage), which is the sum of a reference voltage VR100 and a set voltage, as the first bias voltage when both of the first power source VDD18 and the second power source VDD33 are not activated.

In this instance, the reference voltage generating part 120' may generate the voltage corresponding to the first power source VDD18 as the reference voltage VR100 when both of the first power source VDD18 and the second power source VDD33 are activated, while generating the voltage proportional to the pad voltage applied to the pad as the reference voltage VR100 when both of the first power source VDD18 and the second power source VDD33 are not activated.

This is to stably maintain a voltage corresponding to a reference node NR1 to be the same as the voltage corresponding to the first power source VDD18 when both of the first power source VDD18 and the second power source VDD33 are activated.

To this end, as illustrated in FIG. 7, the reference voltage generating part 120' may further include a third switching element M3. A source terminal of the third switching element M3 may be supplied with the first power source VDD18 and a gate terminal of the third switching element M3 may be supplied with the second power source VDD33. Also, a drain terminal of the third switching element M3 may be connected to a node (or the reference node NR1) for outputting the reference voltage.

As aforementioned, the technology disclosed herein relates to the bias generation circuit (or the bias voltage generator) for fast driving (moving) the bias to correspond to a fast input/output signal.

In the bias generation circuit disclosed herein, when there are not power source voltages of 1.8V and 3.3V in the first power source VDD18 and the second power source VDD33, respectively or there is not one of the voltages in the first power source VDD18 and the second power source VDD33, the first bias BIAS1 may be generated as a specific bias (or the design voltage) using the input pad PAD. On the other hand, when there are both of the two power source voltages, an operation of connecting the bias voltage to a specific power source (e.g., first power source of −1.8V). Accordingly, even when there is no power source, the first bias BIAS1 can serve to generate the specific voltage (or the design voltage) for protecting the input/output (I/O) circuit.

Specifically, the bias generation circuit according to the first embodiment disclosed herein may have a switching function of switching on or off an operation of fast restricting the first bias voltage to a predetermined level (or the specific voltage) and simultaneously an operation of a biasing circuit according to a state of a predetermined power source by being used together with the second switching element M2 and the third switching element M3.

For example, when a semiconductor chip including the bias generation circuit (or the bias voltage generator) 100 uses power sources of 1.8V and 3.3V (for example, VDD18 and VDD33), the second switching element M2 may be turned on and thus the voltage corresponding to the reference node NR1 may be fixed as 1.8V while both of the power sources corresponding to VDD18 and VDD33 are supplied. In this instance, the third switching element M3 may connect a voltage corresponding to the first bias node NB1 to the power source of 1.8V.

Therefore, the voltage of the first bias BIAS1 may have the voltage of 1.8V while all of the power sources are supplied, and can prevent a leakage current from flowing to the first switching element M1.

In the second resistor R2 and the third resistor R3, when the pad P100 is supplied with the power sources, the leakage current flows from the pad P100 to the ground node g100 (or the node corresponding to VSS). This value may be decided based on a resistance value. Hence, the leakage can be reduced by greatly increasing the resistance value.

Second Embodiment

Generation of Second Bias Voltage

A second embodiment disclosed in this specification may be implemented by parts or combination of configurations or steps included in those embodiments or combinations of those embodiments. Hereinafter, for obvious explanation of the first embodiment disclosed herein, repetitive description thereof will be omitted.

According to the second embodiment disclosed herein, a bias voltage generator which supplies at least one bias voltage to a buffer circuit connected to a pad may include a bias generating part that generates a first bias voltage of the at least one bias voltage, and a reference voltage generating part that generates a voltage, which is proportional to a pad voltage applied to the pad, as a reference voltage. Here, the first bias voltage may be a voltage that is the sum of the reference voltage and a set voltage.

Also, according to the second embodiment, the bias voltage generator may be supplied with a first power source (or a first power supply) and a second power source (or a second power supply). When both of the first power source and the second power source are activated (or supplied), the bias voltage generator outputs a voltage corresponding to the first power source as the first bias voltage. On the other hand, when both of the first power source and the second power source are not activated (or not supplied), the bias voltage generator may output a voltage, which is the sum of the reference voltage and the set voltage, as the first bias voltage. Here, the voltage corresponding to the second power source may be greater than the voltage corresponding to the first power source.

According to the second embodiment, the bias generating part may generate a second bias voltage. The second bias voltage may be the voltage corresponding to the second power source when both of the first power source and the second power source are activated, while being the same voltage as the first bias voltage when both of the first power source and the second power source are not activated.

Figure 8:
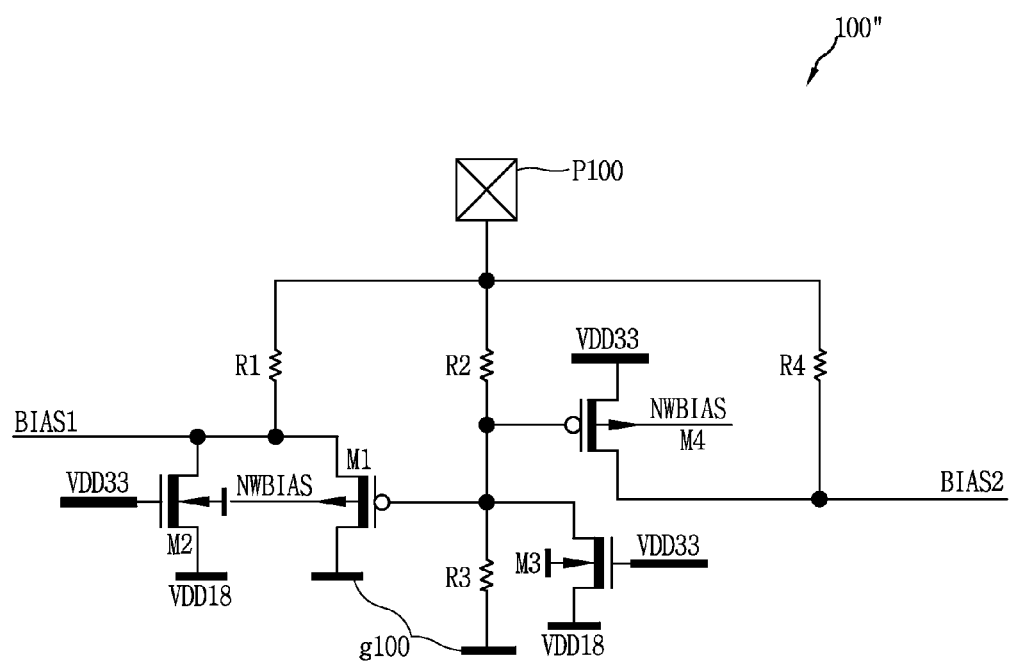
FIG. 8 is a circuit diagram illustrating a bias voltage generator in accordance with a second embodiment disclosed in this specification.

FIG. 8 is a circuit diagram illustrating a bias voltage generator in accordance with a second embodiment disclosed in this specification.

As illustrated in FIG. 8, a bias voltage generator 100" according to the second embodiment disclosed herein may further include a second bias transistor M4 and a fourth resistor R4 in the circuit illustrated in FIG. 7.

The second bias transistor M4 may be a P-type MOS transistor.

According to the second embodiment, when both of the first power source VDD18 and the second power source VDD33 are activated, the second bias transistor M4 is turned on and thus a second bias voltage BIAS2 may be the voltage (e.g., 3.3V) corresponding to the second power source VDD33.

This may result from that when both of the first power source VDD18 and the second power source VDD33 are activated, the voltage of the first bias BIAS1 is the voltage (e.g., 1.8V) corresponding to the first power source VDD18 and thus the second bias transistor M4 is turned on.

Also, according to the second embodiment, when both of the first power source and the second power source are not activated, the voltage of the second bias BIAS2 may be the same voltage as the first bias voltage BIAS1.

For example, the voltage of the second bias BIAS2 may be the same voltage as the voltage of the first bias BIAS1 on the basis of the fourth resistor R4.

Third Embodiment

Generation of Third Bias Voltage and n-Well Bias Voltage

A third embodiment disclosed in this specification may be implemented by parts or combination of configurations or steps included in those embodiments or combinations of those embodiments. Hereinafter, for obvious explanation of the third embodiment disclosed herein, repetitive description thereof will be omitted.

According to the third embodiment disclosed herein, a bias voltage generator which supplies at least one bias voltage to a buffer circuit connected to a pad may include a bias generating part that generates a first bias voltage of the at least one bias voltage, and a reference voltage generating part that generates a voltage, which is proportional to a pad voltage applied to the pad, as a reference voltage. Here, the first bias voltage may be a voltage that is the sum of the reference voltage and a set voltage.

Also, according to the third embodiment, the bias voltage generator may be supplied with a first power source and a second power source. When both of the first power source and the second power source are activated, the bias voltage generator outputs a voltage corresponding to the first power source as the first bias voltage. On the other hand, when both of the first power source and the second power source are not activated, the bias voltage generator may output a voltage, which is the sum of the reference voltage and the set voltage, as the first bias voltage. Here, the voltage corresponding to the second power source may be greater than the voltage corresponding to the first power source.

According to the third embodiment, the bias generating part may generate a second bias voltage. The second bias voltage may be the voltage corresponding to the second power source when both of the first power source and the second power source are activated, while being the same voltage as the first bias voltage when both of the first power source and the second power source are not activated.

Also, according to the third embodiment, the bias voltage generator may include a fourth switching element and a fifth switching element, and generate a third bias voltage of the at least one bias voltage. Here, when both of the first power source and the second power source are activated, the fourth switching element may be turned on based on the second bias voltage and thus the first bias voltage may be generated as the third bias voltage. When both of the first power source and the second power source are not activated, the fifth switching element may be turned on based on the second bias voltage and thus the pad voltage applied to the pad may be generated as the third bias voltage.

According to the third embodiment, the bias voltage generator may further include a sixth switching element and a seventh switching element, and generate an N-well bias voltage of the at least one bias voltage. When both of the first power source and the second power source are activated, the sixth switching element may be turned on based on the first bias voltage and thus the voltage corresponding to the second power source may be generated as the N-well bias voltage. When both of the first power source and the second power source are not activated, the seventh switching element may be turned on based on the second bias voltage and thus the third bias voltage may be generated as the N-well bias voltage.

According to the third embodiment, the buffer circuit may include a pull-up switching element, a pull-down switching element, and a P-type bias transistor and an N-type bias transistor MBIAS1 interposed between the pull-up switching element and the pull-down switching element. A source terminal of the P-type bias transistor may be connected to a drain terminal of the pull-up switching element, and a source terminal of the N-type bias transistor may be connected to a drain terminal of the pull-down switching element. The pad may be connected to a contact node between the P-type bias transistor and the N-type bias transistor. The first bias voltage may be applied to a gate terminal of the N-type bias transistor, the third bias voltage may be applied to a gate terminal of the P-type bias transistor, and the N-well bias voltage may be connected to a body terminal of the P-type bias transistor.

Figure 9:
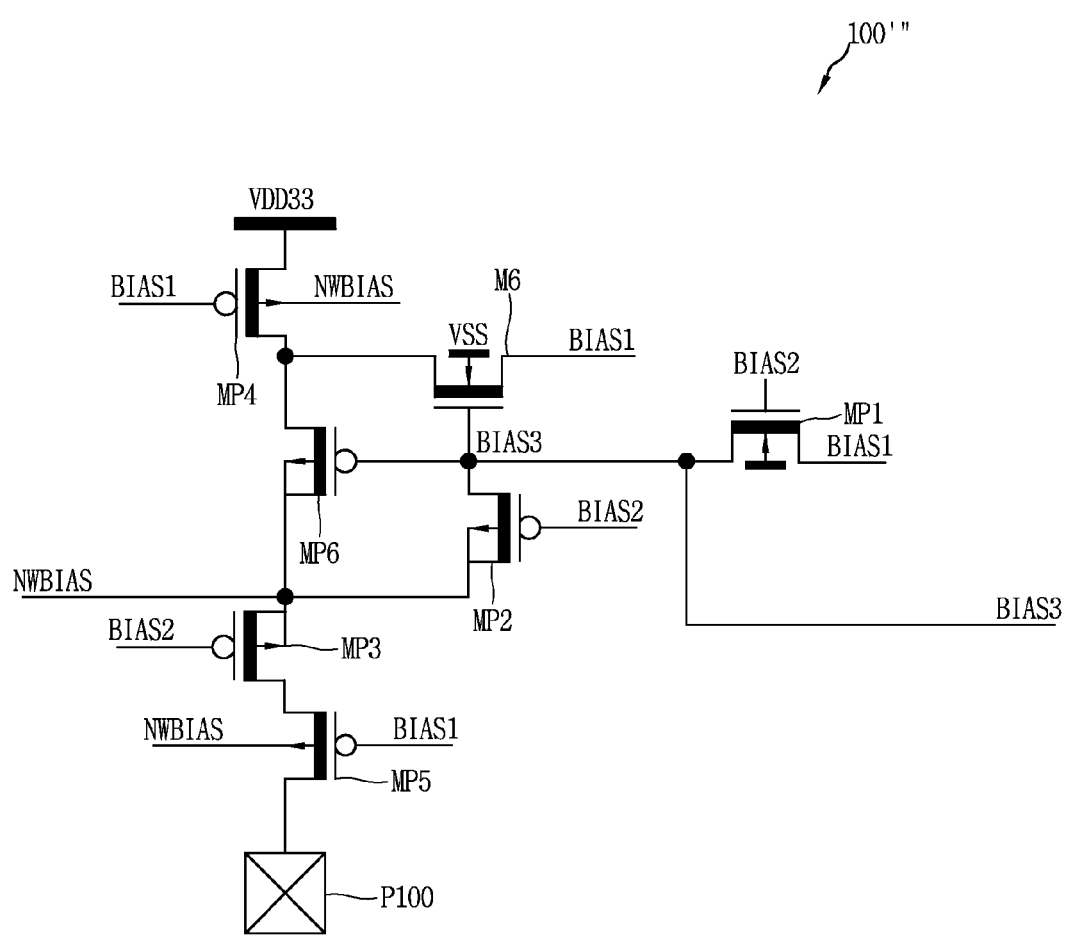
FIG. 9 is an exemplary view illustrating a bias voltage generator in accordance with a third embodiment disclosed in this specification.

FIG. 9 is an exemplary view illustrating a bias voltage generator in accordance with a third embodiment disclosed in this specification.

A bias voltage generator 100''' according to the third embodiment disclosed herein may further include a circuit configuration illustrated in FIG. 9, in addition to the configuration illustrated in FIG. 8.

As illustrated in FIG. 9, the bias voltage generator 100''' may further include a fourth switching element MP1 and a fifth switching element MP2.

According to the third embodiment, the bias voltage generator 100''' may further generate a voltage of a third bias BIAS3 of the at least one bias voltage, which is supplied to the buffer circuit, on the basis of the voltage of the first bias BIAS1, the voltage of the second bias BIAS2, the fourth switching element MP1 and the fifth switching element MP2.

The operation of the bias voltage generator 100''' illustrated in FIG. 9 will now be described in detail. When both of the first power source VDD18 and the second power source VDD33 are activated, the fourth switching element MP1 may be turned on based on the voltage of the second bias BIAS2 and thus the voltage of the first bias BIAS1 may be generated as the voltage of the third bias BIAS3.

When both of the first power source VDD18 and the second power source VDD33 are not activated, the fifth switching element MP2 may be turned on based on the voltage of the second bias BIAS2 and thus the pad voltage applied to the pad P100 may be generated as the voltage of the third bias BIAS3.

According to the third embodiment, the bias voltage generator 100''' may include a sixth switching element MP6 and a seventh switching element MP3.

According to the third embodiment, the bias voltage generator 100''' may further generate a voltage of an N-well bias NWBIAS of the at least one bias voltage, which is supplied to the buffer circuit, on the basis of the voltage of the first bias BIAS1, the voltage of the second bias BIAS2, the sixth switching element MP6 and the seventh switching element MP3.

The operation of the bias voltage generator 100''' illustrated in FIG. 9 will now be described in detail. When both of the first power source VDD18 and the second power source VDD33 are activated, the voltage of the third bias BIAS3 may be the voltage corresponding to the first power source. Accordingly, the sixth switching element MP6 may be turned on and thus the voltage (e.g., 3.3V) corresponding to the second power source VDD33 may be generated as the N-well bias voltage NWBIAS.

Also, when both of the first power source VDD18 and the second power source VDD33 are not activated, the seventh switching element MP3 may be turned on based on the voltage of the second bias BIAS2 (e.g., the design voltage of 1.8V as the first bias voltage) and thus the pad voltage (or the third bias voltage) applied to the pad P100 may be generated as the N-well bias voltage NWBIAS.

Here, in the transistors MP4 and MP5, the NWBIAS is generated in order to prevent a junction node between a drain and a bulk (or a body) from being turned on.

When both of the power sources are applied, the transistor M6 may serve to fix a drain voltage of MP4 as the first bias voltage.

Figure 10:
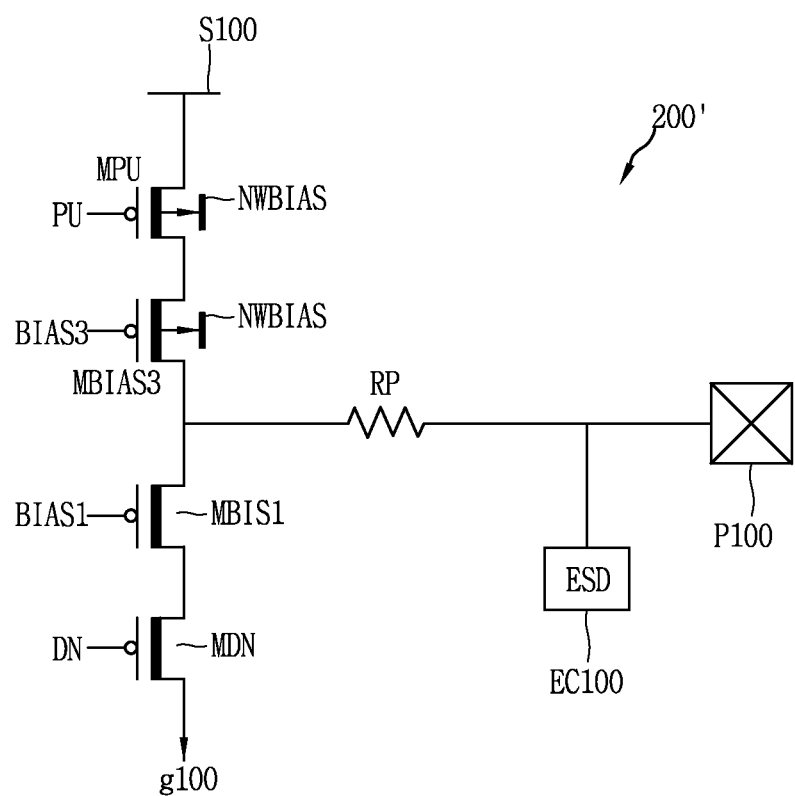
FIG. 10 is a circuit diagram illustrating a buffer circuit in accordance with a third embodiment disclosed in this specification.

FIG. 10 is a circuit diagram illustrating a buffer circuit 200' in accordance with a third embodiment disclosed in this specification.

As illustrated in FIG. 10, a buffer circuit 200' according to the third embodiment disclosed herein may include a pull-up switching element MPU, a pull-down switching element MDN, and a P-type bias transistor MBIAS3 and an N-type bias transistor MBIAS1 interposed between the pull-up switching element MPU and the pull-down switching element MDN.

Also, a source terminal of the P-type bias transistor MBIAS3 may be connected to a drain terminal of the pull-up switching element MPU and a source terminal of the N-type bias transistor MBIAS1 may be connected to a drain terminal of the pull-down switching element MDN.

The pad P100 may be connected to a contact node between the P-type bias transistor MBIAS3 and the N-type bias transistor MBIAS1, and the voltage of the first bias BIAS1 may be applied to a gate terminal of the N-type bias transistor MBIAS1.

Also, the voltage of the third bias BIAS3 may be applied to a gate terminal of the P-type bias transistor MBIAS3, and the N-well bias voltage NWBIAS may be connected to a body terminal (or a bulk terminal) of the P-type bias transistor MBIAS3.

The operation of the buffer circuit illustrated in FIG. 10 is similar to that of the buffer circuit illustrated in FIG. 6, thus description thereof will be omitted.

Fourth Embodiment

Detailed Utilization of Bias Voltages

Hereinafter, description will be given in detail of an exemplary utilization of bias voltages in accordance with a fourth embodiment disclosed herein, with reference to FIGS. 11 and 12.

A fourth embodiment disclosed in this specification may be implemented by parts or combination of configurations or steps included in those embodiments or combinations of those embodiments. Hereinafter, for obvious explanation of the fourth embodiment disclosed herein, repetitive description thereof will be omitted.

Figure 11:
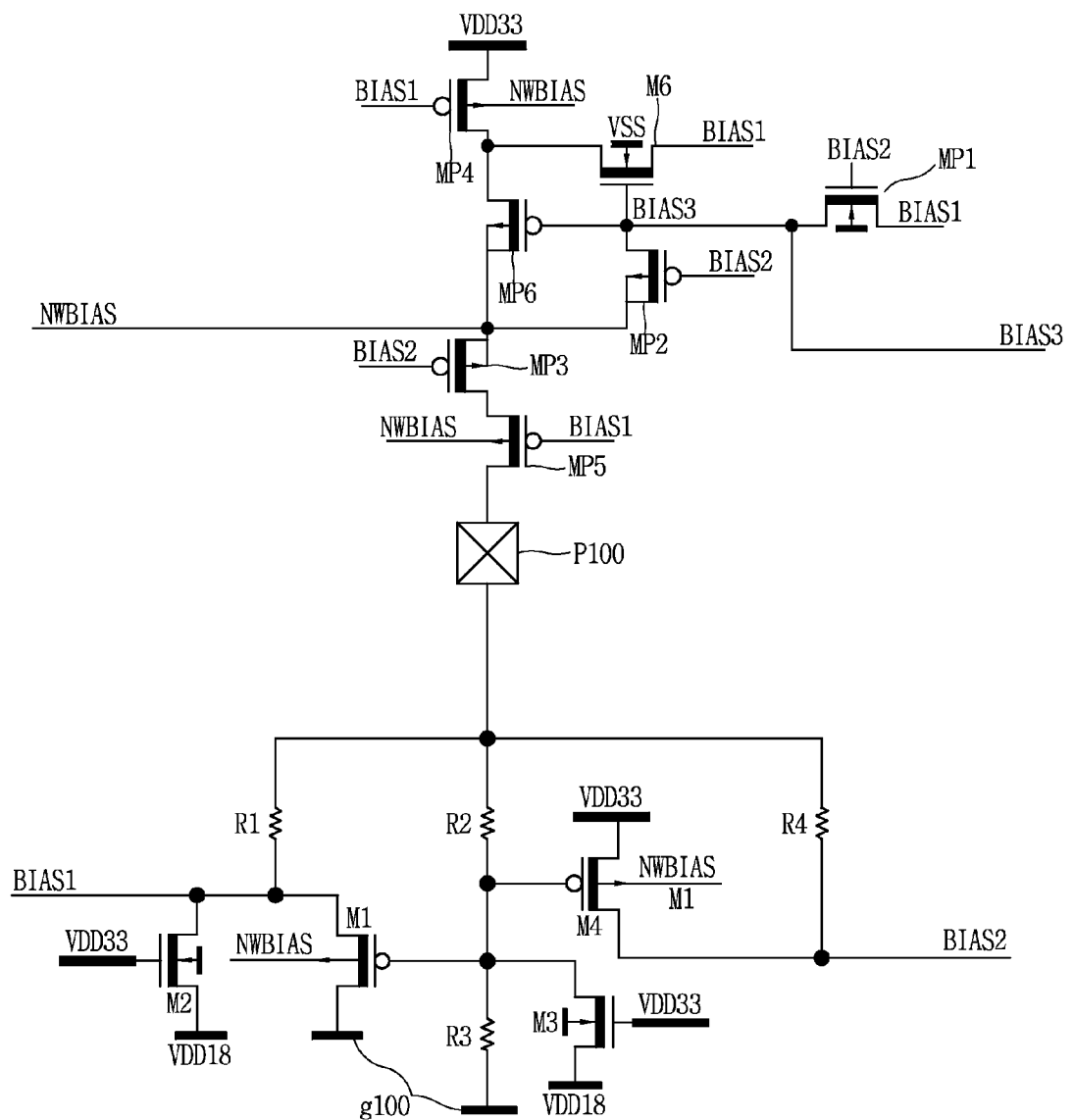
FIG. 11 is a circuit diagram illustrating an overall circuit of a bias voltage generator in accordance with a fourth embodiment disclosed in this specification.

FIG. 11 is a circuit diagram illustrating an overall circuit of a bias voltage generator in accordance with a fourth embodiment disclosed in this specification.

As illustrated in FIG. 11, the part of generating the first bias voltage and the second bias voltage according to the second embodiment may correspond to a circuit connected to a lower end of the pad P100, and the part of generating the third bias voltage and the N-well bias voltage according to the third embodiment may correspond to a circuit connected to an upper end of the pad P100.

As aforementioned, the first bias voltage BIAS1 may be a voltage (e.g., 1.8V) corresponding to the first power source in the presence of power sources, while maintaining the same voltage level as that of the voltage corresponding to the pad P100 in the absence of the power sources.

The voltage corresponding to the pad P100 may be fixed as a specific voltage level (for example, '0.3*pad voltage+ Vth(Mi)' as the design voltage).

When power sources are not supplied (or not activated), the voltage of the second bias BIAS2 may be the same voltage as the voltage of the first bias BIAS1. On the other hand, when the power sources are supplied (or activated), the voltage of the second bias BIAS2 may be an IO voltage (for example, 3.3V, namely, the voltage corresponding to the second power source).

When the power sources are not supplied (or not activated), the voltage of the third bias BIAS3 may be the voltage corresponding to the pad P100 without a limit to a voltage. On the other hand, when the power sources are supplied (or activated), the voltage of the third bias BIAS3 may maintain the level of the voltage (e.g., 1.8V) corresponding to the first power source.

When the power sources are not supplied, the NWBIAS may be the same voltage as the voltage of the third bias BIAS3. On the other hand, when the power sources are supplied, the NWBIAS may maintain the highest power (e.g., 3.3V as the voltage corresponding to the second power source), and prevent a reverse leakage current which is likely to be generated in a pull-up path driver transistor (TR), for example, P-type MOS transistors present on a pull-up path of FIG. 12).

Figure 12:
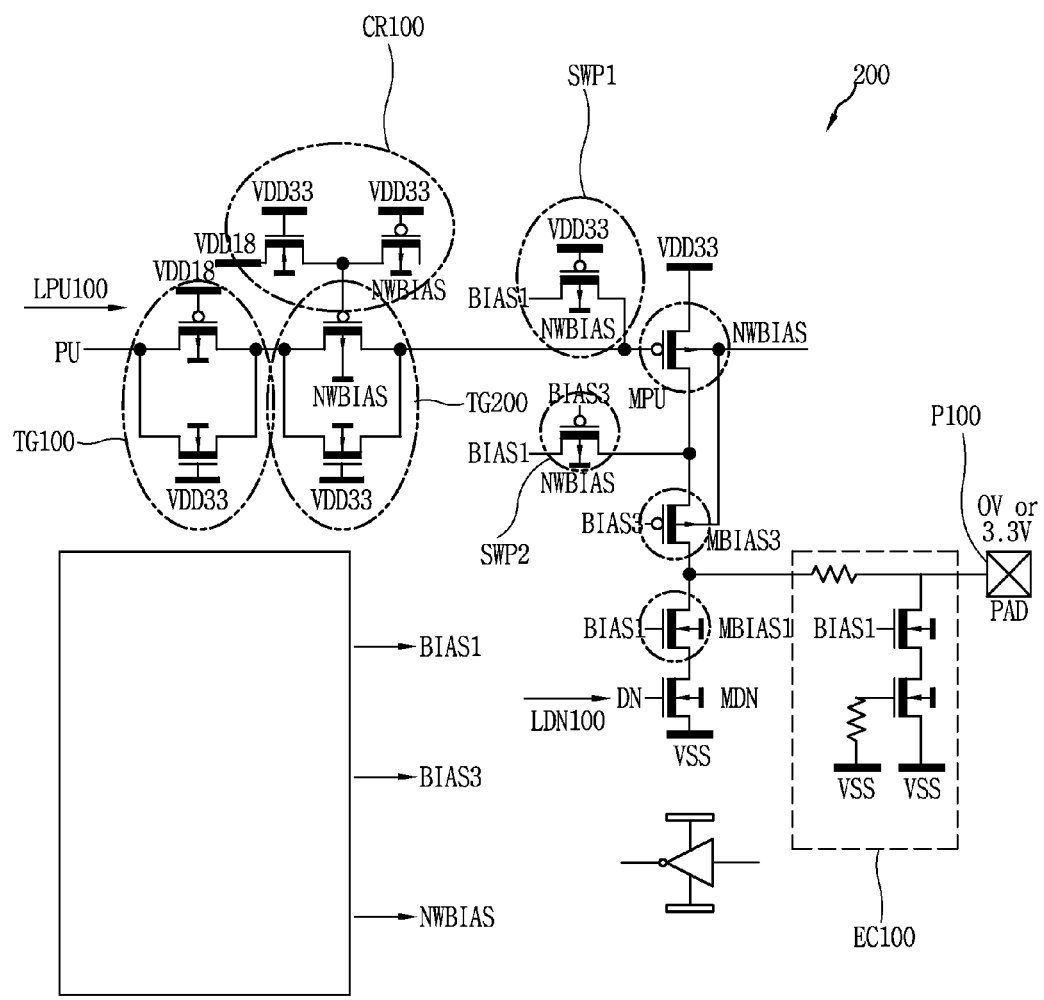
FIG. 12 is a view illustrating a buffer circuit 200 using bias voltages generated by the bias voltage generator in accordance with the fourth embodiment disclosed in this specification.

FIG. 12 is a view illustrating a buffer circuit 200 using bias voltages generated by the bias voltage generator in accordance with the fourth embodiment disclosed in this specification.

As illustrated in FIG. 12, an input/output (I/O) signal level through the pad P100 may be 0V/3.3V, and an allowable voltage (or an element margin voltage) of each transistor TR may be 2V.

An output driver (or the buffer circuit) 200, as illustrated in FIG. 12, may be divided into a pull-up path LPU100 and a pull-down path LDN100.

In a fail-safe mode, in order to prevent a leakage current from flowing toward the pull-up path, the output driver 200 may include a switch (e.g., a second transmission gate TG200) for appropriately opening or shorting a PU signal.

Even such switch should not be supplied with a voltage of an allowable level or more when the power sources are not activated (or not supplied). Therefore, the bias voltage generator 100 can generate totally four biases (i.e., the first bias, the second bias, the third bias and the NWBIAS).

In detail, a first transmission gate TG100 which is located on the pull-up path may serve to activate the pull-up path according to whether or not the power sources are supplied Also, the second transmission gate TG200 may prevent a propagation of a fault voltage (or fault current) to the pull-up path in the fail-safe mode in which at least one of the first power source and the second power source is not activated.

The second transmission gate TG200 may be driven by the second power source VDD33 and a transmission gating circuit CR100.

A switching element SWP1 may maintain a gate voltage of the pull-up switching element MPU to be the same as the first bias voltage (e.g., the design voltage of 1.8V) in the fail-safe mode, such that an over-voltage (e.g., 2V or more which is an element margin) cannot be applied.

A switching element SWP2 may maintain a drain voltage of the P-type bias transistor MBIAS3 to be the same as the first bias voltage (e.g., the design voltage of 1.8V) in the fail-safe mode.

Operations of Bias Voltage Generator and Buffer Circuit for Each Operation Mode Hereinafter, description will be given of operations of the bias voltage generator and the buffer circuit for each operation mode, with reference to FIGS. 13 to 16.

Operation modes described herein may include a normal mode in which both of the first power source VDD18 and the second power source VDD33 are supplied (or activated), a first fail-safe mode (or fail safe mode 1) in which the first power source is supplied but the second power source is not supplied, and a second fail-safe mode (or fail-safe mode 2) in which both of the first power source VDD18 and the second power source VDD33 are not supplied.

Also, for the sake of explanation, it is assumed that a voltage corresponding to the first power source VDD18 is 1.8V, a voltage corresponding to the second power source VDD33 is 3.3V, and the design voltage is 1.8V (when a threshold voltage of a first switching element M1 is 0.7V).

Figure 13:
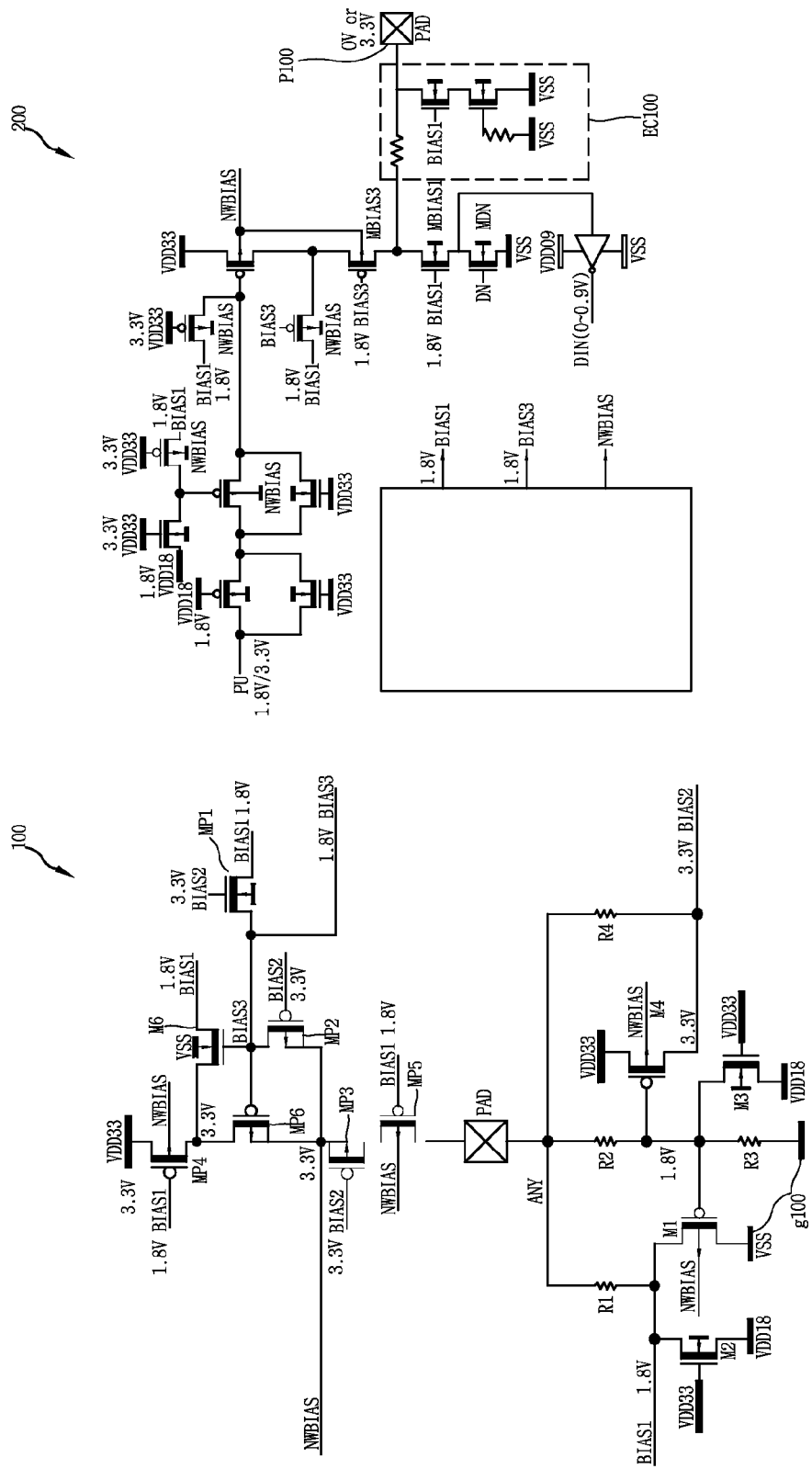
FIG. 13 is a circuit diagram illustrating operations of a bias voltage generator and a buffer circuit in a normal mode.

FIG. 13 is a circuit diagram illustrating operations of a bias voltage generator and a buffer circuit in a normal mode.

As illustrated in FIG. 13, under a state that a power source voltage of 3.3V and a power source voltage of 1.8V are supplied to the VDD33 and the VDD18, respectively, in the normal mode, switches M2 and M3 which are connected to a power source of the bias generation circuit (or the bias voltage generator) 100 operate to generate 1.8V of the first bias BIAS1 and the third bias BIAS3, respectively.

Also, the bias generation circuit 100 may generate NWBIAS of 3.3V. Accordingly, even when any voltage ranging from 0V to 3.3V is generated on the pad of a right-sided driver circuit (or the buffer circuit 200) of FIG. 13, overstress (or overvoltage) of 2V or more may be prevented from being generated from transistors connected to the pad.

Simultaneously, two transmission gate switches (e.g., TG100 and TG200) for connecting a gate of MOS, which is connected to a pull-up PU and a power source (e.g., 3.3V of the second power source) of a driver, and a PU node to each other may be turned on so as to transfer a data signal generated according to data in a pre-driver to the driver.

Figure 14:
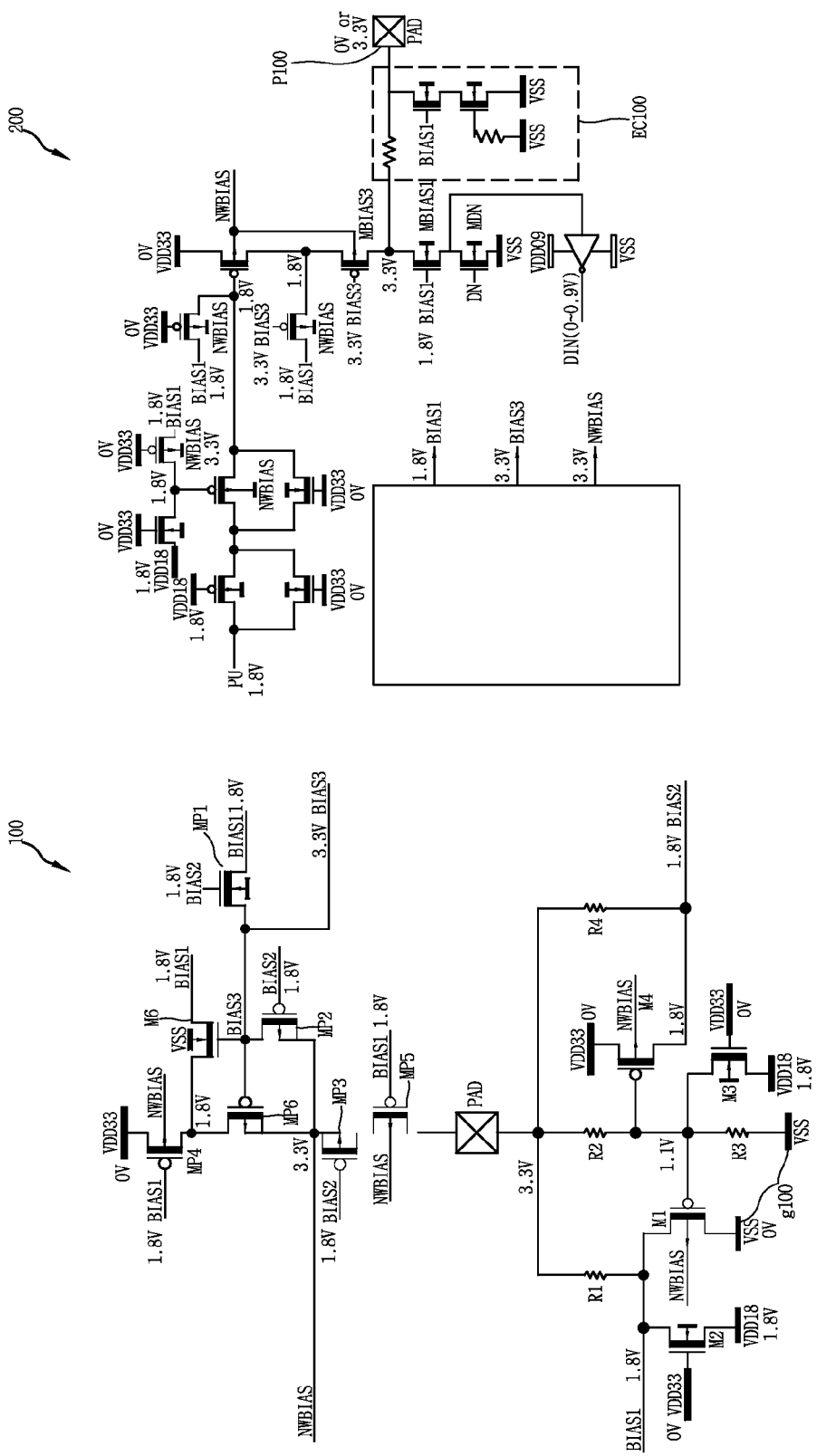
FIG. 14 is a circuit diagram illustrating operations of a bias voltage generator and a buffer circuit in a first fail-safe mode.

FIG. 14 is a circuit diagram illustrating operations of a bias voltage generator and a buffer circuit in a first fail-safe mode.

As illustrated in FIG. 14, a voltage of each node in an operation of the fail safe mode 1 in which the VDD33 (or the second power source) is 0V and the VDD18 (or the first power source) is 1.8V can be noticed.

When only the VDD18 (or the first power source) is present, the buffer circuit may be unable to perform a normal operation of inputting/outputting data. Since the VDD33 is 0V, the buffer circuit should perform a fail-safe operation, similar to the absence of every power source under the state that the pad voltage of 3.3V is supplied.

Hereinafter, the operation of the bias generation circuit (or the bias voltage generator) will be described. The switching elements which are connected to the VDD18 and the VDD33 for operation may all be turned off and thus be converted into a mode of generating a voltage dependent on the pad.

When the voltage corresponding to the pad is 3.3V, a node of the first bias BIAS1 may be restricted from being supplied with a voltage of 1.8V (e.g., the design voltage) or more by PMOS (e.g., M1) which performs a clamp operation.

Similar to the first bias BIAS1, the second bias BIAS2 which is required for generating the third bias BIAS3 and the NWBIAS may also be clamped at more than 1.8V.

The second bias BIAS2 may be used in a circuit, which generates the third bias BIAS3 and the NWBIAS, of the upper circuit of the bias generator.

When the first bias BIAS1 and the second bias BIAS2 are 1.8V, a path connected from the pad to the NWBIAS and a path connected from the pad to the third bias BIAS3 may be connected, such that the NWBIAS and third bias BIAS3 may all be the same voltage as the pad voltage.

The two voltages may be applied to the pull-up path of the driver so as to block the path from the pad to the VDD33, thereby preventing the flow of a leakage current.

Also, the generation of a reverse voltage in the pad and the NWBIAS can be prevented, which may result in preventing a turn-on of a junction node between a bulk and a channel of PMOS.

Figure 15:
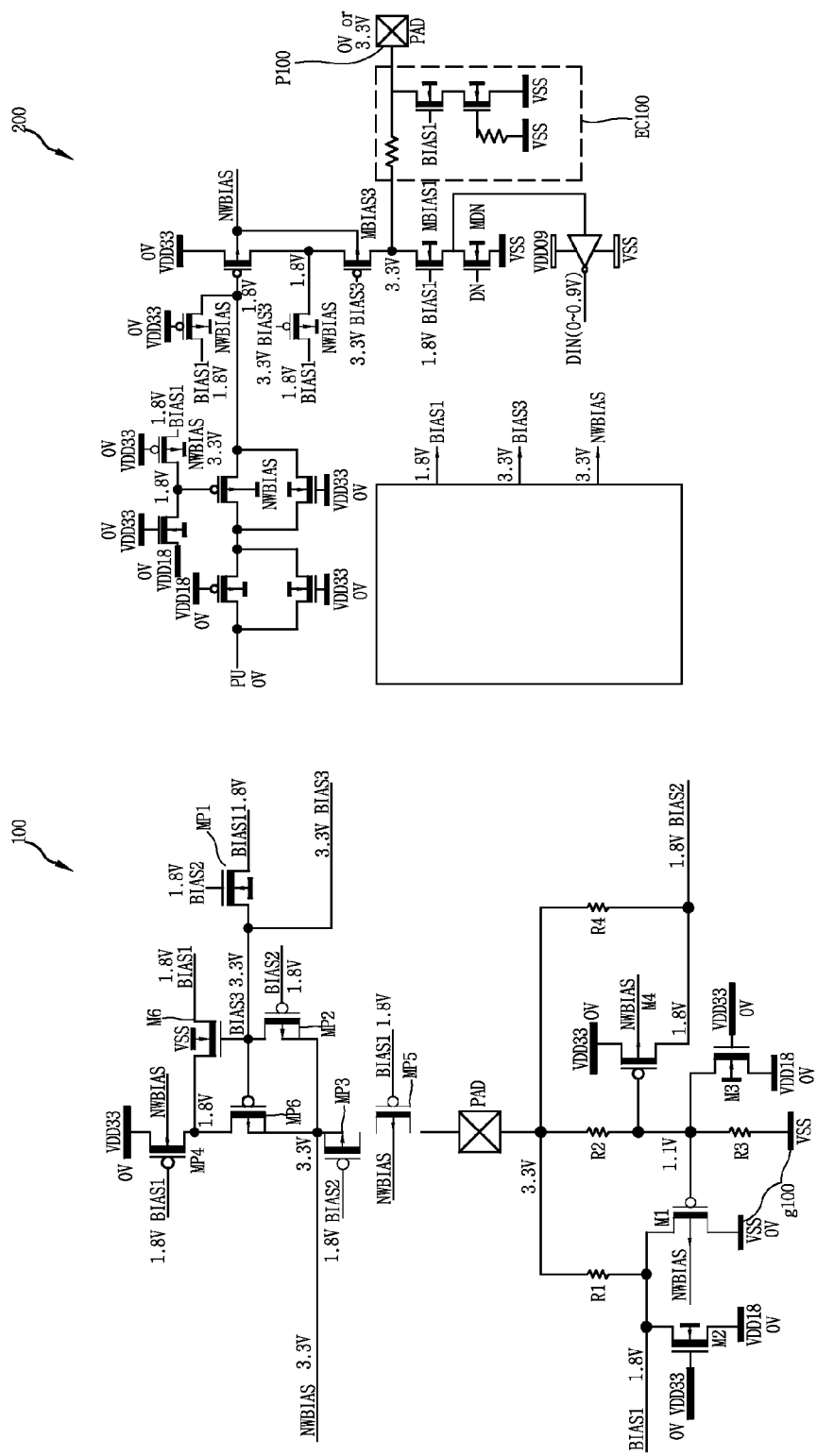
FIG. 15 is a circuit diagram illustrating operations of a bias voltage generator and a buffer circuit in a second fail-safe mode (fail safe mode2).

FIG. 15 is a circuit diagram illustrating operations of a bias voltage generator and a buffer circuit in a second fail-safe mode (or fail safe mode2).

In FIG. 15, both of VDD33 and VDD18 are 0V and thus the second fail-safe mode operation is performed. Here, the operation is similar to that illustrated in FIG. 14, thus detailed description thereof will be omitted.

Figure 16:
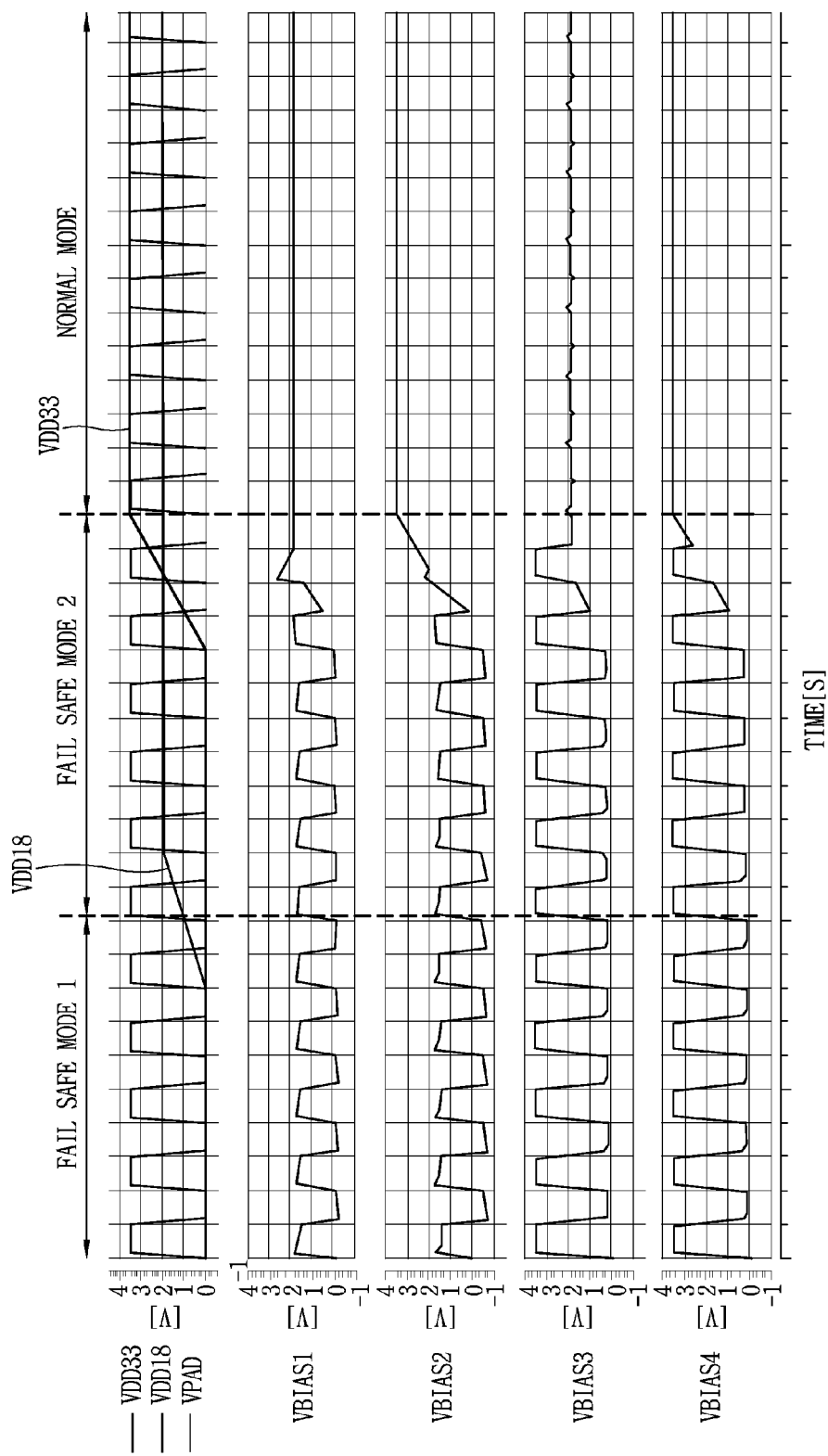
FIG. 16 is an exemplary view illustrating simulation results of bias voltages for each operation mode.

FIG. 16 is an exemplary view illustrating simulation results of bias voltages for each operation mode.

As illustrated in FIG. 16, waveforms of four bias voltages VBIAS1, VBIAS2, VBIAS3 and NWBIAS for each of the first fail-safe mode (or fail safe mode 1), the second fail-safe mode (or fail safe mode 2) and the normal mode can be checked.

As described so far, according to the technology disclosed in this specification, by further employing a circuit which stably restricts a bias voltage supplied to a buffer circuit within a short time in a fail-safe mode in which power sources are not activated (or not supplied), an input/output circuit within a chip can be safely protected while a high-speed signal is applied.

Also, a fail-safe operation speed of the input/output circuit can increase and simultaneously a signal transfer speed of a system using the input/output buffer can increase.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

The invention claimed is:

1. A circuit configured to supply at least one bias voltage to a buffer circuit connected to a pad, the circuit comprising:
   a bias voltage generator configured to generate a first bias voltage, wherein the at least one bias voltage comprises the first bias voltage; and
   a reference voltage generator configured to generate a reference voltage proportional to a pad voltage applied to the pad,
   wherein the first bias voltage is selectively a sum of the reference voltage and a predetermined threshold voltage,
   wherein the buffer circuit comprises a pull-up switching element, a pull-down switching element, and an N-type bias transistor connected between the pull-up switching element and the pull-down switching element, wherein the pad is connected to a contact node between the pull-up switching element and the N-type bias transistor, and wherein the at least one bias voltage is applied to a gate terminal of the N-type bias transistor.

2. The circuit of claim 1, wherein the bias voltage generator comprises a first resistor, and a first switching element, wherein the first resistor is connected between the pad and a first output node for outputting the first bias voltage, wherein the first switching element is connected between the first output node and a ground node, and wherein the reference voltage is applied to a gate terminal of the first switching element.

3. The circuit of claim 2, wherein the first switching element is a p-type MOS transistor, and wherein the predetermined threshold voltage is a threshold voltage corresponding to the first switching element.

4. The circuit of claim 1, wherein the reference voltage generator generates the reference voltage on the basis of a voltage distribution between the pad voltage and a ground voltage corresponding to a ground node.

5. The circuit of claim 4, wherein the reference voltage generator comprises a second resistor and a third resistor, and wherein the voltage distribution is carried out based on the second resistor and the third resistor.

6. The circuit of claim 5, wherein the second resistor is connected between the pad and a reference node, wherein the third resistor is connected between the reference node and the ground node, and wherein the reference voltage is a voltage corresponding to the reference node.

7. The circuit of claim 1, wherein the bias voltage generator is supplied with a first power source and a second power source, wherein the bias voltage generator outputs a voltage corresponding to the first power source as the first bias voltage when both of the first power source and the second power source are on, wherein the bias voltage generator outputs the first bias voltage as the sum of the predetermined threshold voltage and the reference voltage when both of the first power source and the second power source are off, and wherein a voltage corresponding to the second power source is greater than a voltage corresponding to the first power source.

8. The circuit of claim 7, wherein the power corresponding to the first power source is 1.8V, and wherein the voltage corresponding to the second power source is 3.3V.

9. The circuit of claim 7, wherein the bias voltage generator further comprises a second switching element, wherein a source terminal of the second switching element is supplied with the first power source, wherein a gate terminal of the second switching element is supplied with the second power source, and wherein a drain terminal of the second switching element is connected to a node for outputting the first bias voltage.

10. The circuit of claim 7, wherein the reference voltage generator outputs the voltage corresponding to the first power source when both of the first power source and the second power source are on, and wherein the reference voltage generator generates the reference voltage when both of the first power source and the second power source are off.

11. The circuit of claim 10, wherein the reference voltage generator further comprises a third switching element, wherein a source terminal of the third switching element is supplied with the first power source, wherein a gate terminal of the third switching element is supplied with the second power source, and wherein a drain terminal of the third switching element is connected to a node for outputting the reference voltage.

12. The circuit of claim 7, wherein the bias voltage generator outputs a second bias voltage, wherein the second bias voltage is the voltage corresponding to the second power source when both of the first power source and the second power source are on, and wherein the second bias voltage is a same voltage as the first bias voltage when both of the first power source and the second power source are off.

13. The circuit of claim 12, further comprising a fourth switching element and a fifth switching element, wherein the bias voltage generator generates a third bias voltage, wherein the at least one bias voltage comprises the third bias voltage, wherein the fourth switching element is turned on in response to the second bias voltage and thus the first bias voltage is a same voltage as the third bias voltage when both of the first power source and the second power source are turned on, and wherein the fifth switching element is turned on in response to the second bias voltage and thus the pad voltage applied to the pad is generated as the third bias voltage when both of the first power source and the second power source are turned off.

14. The circuit of claim 13, further comprising a sixth switching element and a seventh switching element, wherein the bias voltage generator generates an N-well bias voltage, wherein the at least one bias voltage comprises the N-well bias voltage, wherein the sixth switching element is turned on in response to the third bias voltage and thus the voltage corresponding to the second power source is a same voltage as the N-well bias voltage when both of the first power source and the second power source are on, and wherein the seventh switching element is turned on in response to the second bias voltage and thus the pad voltage applied to the pad is a same voltage as the N-well bias voltage when both of the first power source and the second power source are off.

15. The circuit of claim 14, wherein the buffer circuit comprises a P-type bias transistor connected between the pull-up switching element and the pull-down switching element, wherein a source terminal of the P-type bias transistor is connected to a drain terminal of the pull-up switching element, wherein a source terminal of the N-type bias transistor is connected to a drain terminal of the pull-down switching element, wherein the pad is connected to the contact node between the P-type bias transistor and the N-type bias transistor, wherein the first bias voltage is applied to a gate terminal of the N-type bias transistor, wherein the third bias voltage is applied to a gate terminal of the P-type bias transistor, and wherein the N-well bias voltage is connected to a body terminal of the P-type bias transistor.

* * * * *